US012702040B2

(12) United States Patent
Liang et al.

(10) Patent No.: US 12,702,040 B2
(45) Date of Patent: Aug. 4, 2026

(54) LOW TEMPERATURE SUBSTRATE BONDING METHOD

(71) Applicant: TAIWAN SEMICONDUCTOR MANUFACTURING COMPANY, LTD., Hsinchu (TW)

(72) Inventors: Zheng-Yong Liang, Hsinchu (TW); Yu-Yun Peng, Hsinchu (TW); Keng-Chu Lin, Hsinchu (TW); Wei-Ting Yeh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 373 days.

(21) Appl. No.: 18/433,778

(22) Filed: Feb. 6, 2024

(65) Prior Publication Data

US 2025/0253287 A1     Aug. 7, 2025

(51) Int. Cl.
*H10W 72/00* (2026.01)

(52) U.S. Cl.
CPC .... *H10W 72/073* (2026.01); *H10W 72/07331* (2026.01); *H10W 72/07335* (2026.01)

(58) Field of Classification Search
CPC ......... H10W 72/073; H10W 72/07331; H10W 72/07335

USPC .......................................................... 438/107
See application file for complete search history.

(56) References Cited

U.S. PATENT DOCUMENTS

| | | | | |
|---|---|---|---|---|
| 7,585,786 | B2 * | 9/2009 | Goo | .................... H10W 20/097 |
| | | | | 438/785 |
| 12,489,082 | B2 * | 12/2025 | Liang | ...................... H10P 14/60 |
| 12,512,439 | B2 * | 12/2025 | Liang | .................... H10P 10/128 |

* cited by examiner

*Primary Examiner* — Tu-Tu V Ho
(74) *Attorney, Agent, or Firm* — Birch, Stewart, Kolasch & Birch, LLP

(57) ABSTRACT

A method includes: forming, on a first substrate, a first bonding layer including a first metal oxide material in an amorphous state; forming, on a second substrate, a second bonding layer including a second metal oxide material in an amorphous state; annealing the first and second bonding layers using a laser source, so as to convert the first and second metal oxide materials to a crystalline state; forming, on the first bonding layer, a third bonding layer including a third metal oxide material in an amorphous state; forming, on the second bonding layer, a fourth bonding layer including a fourth metal oxide material in an amorphous state; bonding the first and second substrates to each other through the first to fourth bonding layers; and annealing the third and fourth bonding layers using a heat source, so as to convert the third and fourth metal oxide materials to a crystalline state.

20 Claims, 3 Drawing Sheets

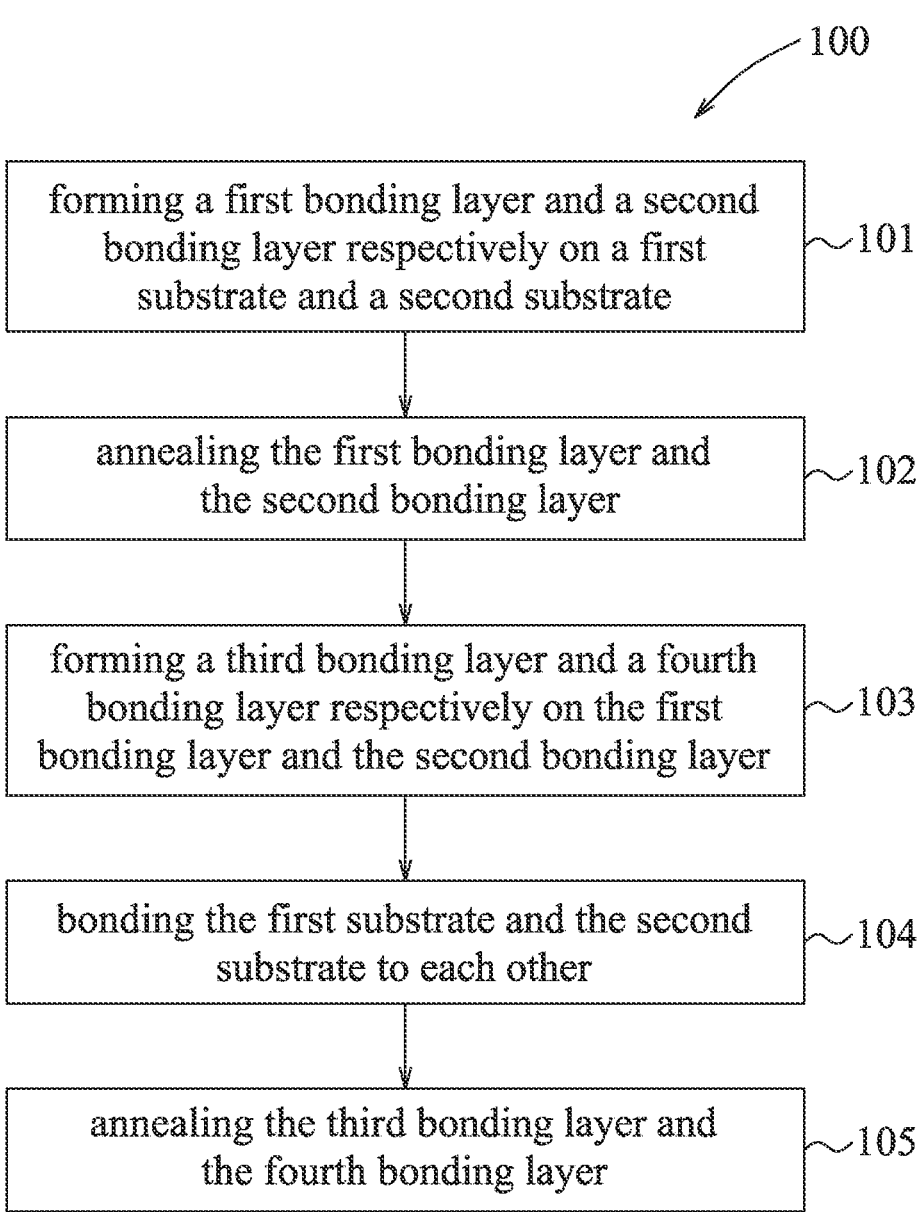

100 forming a first bonding layer and a second bonding layer respectively on a first substrate and a second substrate ~101 annealing the first bonding layer and the second bonding layer ~102 forming a third bonding layer and a fourth bonding layer respectively on the first bonding layer and the second bonding layer ~103 bonding the first substrate and the second substrate to each other ~104 annealing the third bonding layer and the fourth bonding layer ~105

FIG. 1

600
603
604
601
602
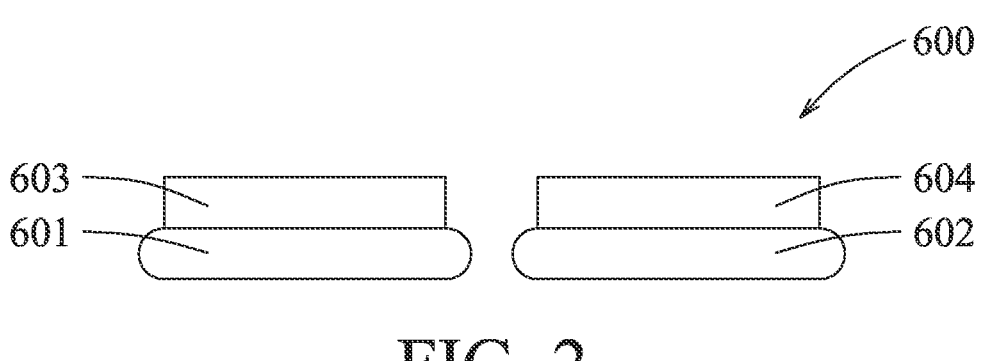
FIG. 2
600
603
604
601
602
FIG. 3
600
605
606
603
604
601
602
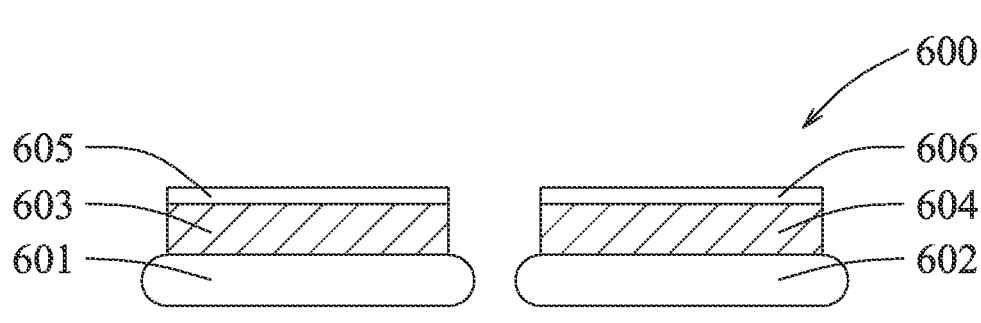
FIG. 4

600

602
604
605
606
603
601

600

602
604
605
606
603
601

LOW TEMPERATURE SUBSTRATE BONDING METHOD

BACKGROUND

The semiconductor integrated circuit (IC) industry has, over the decades, experienced tremendous advancements and is still undergoing vigorous development. With dramatic advances in technology, the industry pays much attention on the development of small IC devices with high performance and low power consumption. Since substrate is an important component of a semiconductor device, substrate bonding issue, such as heat treatment temperature issue, needs be solved in order to facilitate manufacturing process of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flow chart illustrating a method for manufacturing a semiconductor structure in accordance with some embodiments.

FIGS. 2 to 6 are schematic sectional views illustrating intermediate stages of the method for manufacturing a semiconductor structure in accordance with some embodiments.

DETAILED DESCRIPTION

Figure 5:
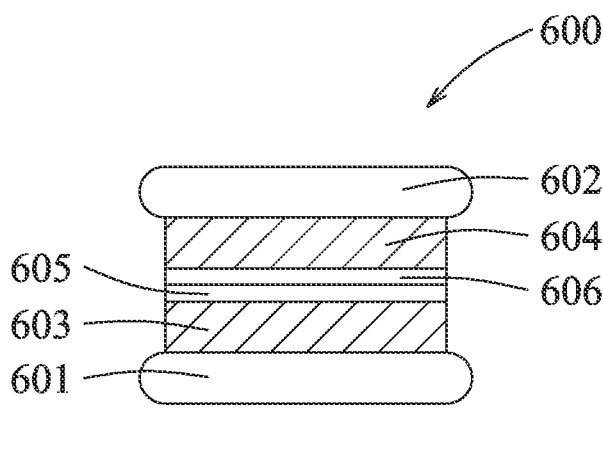

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

Figure 6:
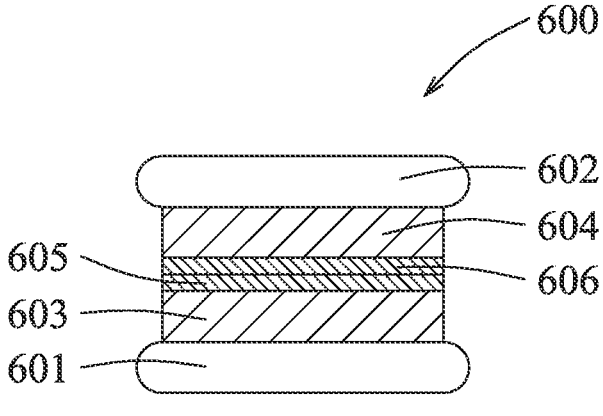

The present disclosure is directed to a substrate bonding method. In the substrate bonding method (for example, fusion bonding), a semiconductor structure includes two substrates that are to be bonded to each other through multiple metal oxide bonding layers at a low temperature. The present disclosure provides an exemplary method to manufacture, for example, but not limited to, a semiconductor structure that includes a first substrate that is a device substrate formed with a semiconductor device, and a second substrate that is a device substrate formed with a semiconductor device or a blank substrate not formed with a semiconductor device and that is bonded to the first substrate through multiple metal oxide bonding layers, as shown in FIG. 6. The semiconductor structure may be further applied in any appropriate applications, for example, but not limited to, backside illumination complementary metal oxide semiconductor (CMOS) image sensor, digital signal processors, memory devices, analog processors, radio frequency (RF) circuits, resistors, inductors and capacitors. Other suitable applications are within the contemplated scope of the present disclosure.

FIG. 1 is a flow chart illustrating a method 100 for manufacturing a semiconductor structure in accordance with some embodiments. FIGS. 2 to 6 are schematic sectional views of semiconductor structures 600 during various stages of the method 100. The method 100 and the semiconductor structures 600 will be described together below. It should be noted that additional steps can be provided before, after or during the method 100, and some of the steps described herein may be replaced by other steps or be eliminated. Similarly, further additional features may be present in the semiconductor structures 600, and/or features present may be replaced or eliminated in additional embodiments.

Referring to FIGS. 1 and 2, the method 100 begins at step 101, where a first bonding layer 603 and a second bonding layer 604 are respectively formed on a first substrate 601 and a second substrate 602. At least one of the first substrate 601 or the second substrate 602 is formed with a semiconductor device (not shown). In other words, each of the first substrate 601 and the second substrate 602 is formed with a respective semiconductor device, or the first substrate 601 is formed with a semiconductor device while the second substrate 602 is not formed with a semiconductor device. The first bonding layer 603 includes a first metal oxide material in an amorphous state. The second bonding layer 603 includes a second metal oxide material in an amorphous state.

In some embodiments, each of the first substrate 601 and the second substrate 602 is a semiconductor substrate which may include, for example, but not limited to, an elemental semiconductor or a compound semiconductor. An elemental semiconductor includes a single species of atoms, such as silicon (Si) or germanium (Ge) in column XIV of the periodic table, and may be in crystalline, polycrystalline, or amorphous form. Other suitable materials are within the contemplated scope of the present disclosure. A compound semiconductor includes two or more elements, and examples thereof may include, but not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials are within the contemplated scope of the present disclosure. The compound semiconductor may have a gradient feature in which the compositional ratio thereof changes from one location to another location therein. The compound semiconductor may be formed over a silicon substrate. The compound semiconductor may be strained. In some embodiments, the semiconductor substrate may include a multilayer compound semiconductor substrate. In some embodiments, the semiconductor substrate may be a semiconductor on insulator (SOI) (e.g., silicon germanium on insulator (SGOI)). Generally, an SOI substrate includes a layer of a semiconductor material such as epitaxial silicon, germanium, silicon germanium, or combinations thereof. Other suitable materials are within the contemplated scope of the present disclosure. The SOI substrate may be doped with a P-type dopant, for example, but not limited to, boron (Br), aluminum (Al), or gallium (Ga). Other suitable materials are within the contemplated scope of the present disclosure. Alternatively, the SOI substrate may be doped with an N-type dopant, for example, but not limited to, nitrogen (N), phosphorus (P), or arsenic (As). Other suitable materials are within the contemplated scope of the present disclosure.

In some embodiments, the semiconductor device may include a front-end-of-line (FEOL) portion formed on the substrate 601/602 and including, for example, but not limited to, a logic circuitry with transistors, a memory circuitry having memory elements, passive elements, and/or other suitable elements; a middle-end-of-line (MEOL) portion formed on the FEOL portion and including, for example, but not limited to, metal contacts to be electrically connected to electrodes of the elements in the FEOL portion (for example, but not limited to, gate, source, and drain electrodes of the transistors), interlayer dielectric (ILD) layers among the metal contacts, and/or other suitable elements; and a back-end-of-line (BEOL) portion formed on the MEOL portion and including, for example, but not limited to, metallization layers (metal lines or vias) formed to electrically connect the metal contacts to an external circuitry out of the semiconductor device, and additional ILD layers among the metallization layers. The semiconductor device may be formed using any appropriate materials and/or methods. In some embodiments, the BEOL portion may further include a protective dielectric layer which is formed opposite to the MEOL portion, and which may serve as an etch stop layer so as to protect other elements of the BEOL portion formed beneath the protective dielectric layer from being damaged due to steps performed subsequently. The protective dielectric layer may include a dielectric nitride such as silicon nitride, silicon carbon nitride, or other suitable materials. Other suitable materials and methods for forming the semiconductor device are within the contemplated scope of the present disclosure.

In some embodiments, the first bonding layer 603 and the second bonding layer 604 may be respectively formed on the first substrate 601 and the second substrate 602 by a suitable deposition process as is known to those skilled in the art of semiconductor fabrication, for example, but not limited to, spin-on coating, plasma-enhanced chemical vapor deposition (PECVD), plasma-enhanced atomic layer deposition (PEALD), or the like. Other suitable deposition techniques are within the contemplated scope of the present disclosure. In some embodiments, the deposition process may be conducted at a temperature that is less than or equal to about 280° C., so as to form the first bonding layer 603 in the amorphous state and the second bonding layer 604 in the amorphous state respectively on the first substrate 601 and the second substrate 602. In some embodiments, each of the first bonding layer 603 and the second bonding layer 604 may have a thickness that falls within a range of from about 1500 Å to about 2500 Å. In some embodiments, each of the first bonding layer 603 and the second bonding layer 604 may have a density that falls within a range of from about 3.2 g/cm$^3$ to about 3.8 g/cm$^3$. In some embodiments, each of the first bonding layer 603 and the second bonding layer 604 may have a surface roughness that is less than or equal to about 100 Å. In some embodiments, each of the first bonding layer 603 and the second bonding layer 604 may have a stress that falls within a range of from about-200 Mpa to about 200 Mpa. In some embodiments, each of the first metal oxide material of the first bonding layer 603 and the second metal oxide material of the second bonding layer 604 may have a general formula represented by $MO_x$, where M is selected from aluminum (Al), magnesium (Mg), titanium (Ti), zinc (Zn), or combinations thereof, and x is a number satisfying the valence of M. In some embodiments, each of the first metal oxide material of the first bonding layer 603 and the second metal oxide material of the second bonding layer 604 may include, for example, but not limited to, aluminum oxide, magnesium oxide, titanium oxide, zinc oxide, or combinations thereof. Other suitable metal oxide materials are within the contemplated scope of the present disclosure. In some embodiments where each of the first metal oxide material of the first bonding layer 603 and the second metal oxide material of the second bonding layer 604 includes titanium oxide, an atomic ratio of titanium (Ti) to oxygen (O) in each of the first bonding layer 603 and the second bonding layer 604 may be about 0.5. In some embodiments, an atomic percent of carbon (C) in each of the first bonding layer 603 and the second bonding layer 604 may be less than or equal to about 5%.

Referring to FIGS. 1 and 3, the method 100 then proceeds to step 102, where the first bonding layer 603 and the second bonding layer 604 are annealed using a laser source (not shown) and/or a heat source (not shown), so as to convert each of the first metal oxide material of the first bonding layer 603 and the second metal oxide material of the second bonding layer 604 from the amorphous state to a crystalline state.

In some embodiments where each of the first substrate 601 and the second substrate 602 is formed with a respective semiconductor device or where the first substrate 601 is formed with a semiconductor device while the second substrate 602 is not formed with a semiconductor device, the first bonding layer 603 and the second bonding layer 604 may be annealed using the laser source as shown in FIG. 3, so as to prevent the semiconductor device(s) from being damaged. In some embodiments where each of the first metal oxide material of the first bonding layer 603 and the second metal oxide material of the second bonding layer 604 includes titanium oxide, the laser source may be a krypton fluoride (KrF) excimer laser source that has a laser wavelength of 248 nm, or an argon fluoride (ArF) excimer laser source that has a laser wavelength of 193 nm, so as to achieve better laser energy absorption of each of the first bonding layer 603 and the second bonding layer 604. The wavelength of the laser source may be determined based on the metal oxide material used by each of the first bonding layer 603 and the second bonding layer 604. In some embodiments, the first bonding layer 603 and the second bonding layer 604 may be annealed by a laser with laser power that falls within a range of from about 1 W to about 100 W. In some embodiments, the first bonding layer 603 and the second bonding layer 604 may be annealed using at least one laser pulse. The at least one laser pulse includes 1 to 200 laser pulses. In some embodiments, the laser pulse(s) may have a pulse duration that falls within a range of from about 10 ps to about 100 ps for picosecond lasers and a range of from about 1 ns to about 50 ns for nanosecond lasers. In some embodiments, the laser pulse(s) may have a pulse repetition rate that falls within a range of from about 1 kHz to hundreds of kHz. In some embodiments, the laser pulse(s) may have an energy density that falls within a range of from about 10 mJ/cm$^2$ to about 100 mJ/cm$^2$ for picosecond lasers and a range of from about 50 mJ/cm$^2$ to about 500 mJ/cm$^2$ for nanosecond lasers. In some embodiments, the first bonding layer 603 and the second bonding layer 604 may be annealed for a period of time that falls within a range of from about 30 seconds to about 1 hour. The number, the pulse duration and the energy density of the laser pulse(s), the laser power, and the annealing time may be determined based on a target thickness and other target film properties (for example, but not limited to, a target composition, a target density, a target stress, a target surface roughness, or combinations thereof) of each of the first bonding layer 603 and the second bonding layer 604. The pulse repetition rate of the laser pulse(s) may be determined based on a processing speed of the laser source and ability of each of the first bonding layer 603 and the second bonding layer 604 to dissipate heat. In some embodiments, the first bonding layer 603 and the second bonding layer 604 may be annealed by a laser with a laser spot size that falls within a range of from several μm to a few thousand μm. In some embodiments, the first bonding layer 603 and the second bonding layer 604 may be annealed at a laser scanning speed that falls within a range of from about 1 mm/s to about 10 mm/s. The laser scanning speed may be determined based on a target laser spot size and a target energy density of the laser pulse(s). A slower laser scanning speed can lead to better laser energy absorption and better annealing effect of each of the first bonding layer 603 and the second bonding layer 604. In some embodiments, the first bonding layer 603 and the second bonding layer 604 may be annealed in an environment that contains reactant gas, for example, but not limited to, air, nitrogen gas, noble gas, or combinations thereof. Other suitable reactant gases are within the contemplated scope of the present disclosure. The reactant gas can prevent unwanted reactions of each of the first bonding layer 603 and the second bonding layer 604 during the laser annealing process. In some embodiments, the first bonding layer 603 and the second bonding layer 604 may be annealed under a circumstance where the first substrate 601 and the second substrate 602 are adjusted to a temperature that falls within a range of from about room temperature to about 250° C. In some embodiments, each of the first bonding layer 603 and the second bonding layer 604, after being annealed, may have a surface roughness that falls within a range of from about 3 Å to about 50 Å. In some embodiments, each of the first bonding layer 603 and the second bonding layer 604, after being annealed, may have an average thermal conductivity that falls within a range of from about 5.5 W/(m·K) to about 11.5 W/(m·K). In some embodiments, each of the first bonding layer 603 and the second bonding layer 604, after being annealed, may have a tetragonal structure and miller indices (h,k,l) of (1,0,1). In some embodiments, each of the first bonding layer 603 and the second bonding layer 604, after being annealed, may have a crystalline grain size that falls within a range of from about 5 nm to about 35 nm.

In some embodiments where the first substrate 601 is formed with a semiconductor device while the second substrate 602 is not formed with a semiconductor device, the second bonding layer 604 may be annealed using the heat source, instead of the laser source. In some embodiments, the thermal annealing process may be conducted on the second binding layer 604 at a temperature that is greater than or equal to 280° C.

Referring to FIGS. 1 and 4, the method 100 then proceeds to step 103, where a third bonding layer 605 and a fourth bonding layer 606 are respectively formed on the first bonding layer 603 and the second bonding layer 604. The third bonding layer 605 includes a third metal oxide material in an amorphous state. The fourth bonding layer 606 includes a fourth metal oxide material in an amorphous state.

In some embodiments, the third bonding layer 605 and the fourth bonding layer 606 may be respectively formed on the first bonding layer 603 and the second bonding layer 604 by a suitable deposition process as is known to those skilled in the art of semiconductor fabrication, for example, but not limited to, plasma-enhanced chemical vapor deposition (PECVD), plasma-enhanced atomic layer deposition (PEALD), or the like. Other suitable deposition techniques are within the contemplated scope of the present disclosure. Thereafter, the third bonding layer 605 and the fourth bonding layer 606 may be subjected to a planarization process (for example, but not limited to, a chemical mechanical polishing (CMP) process), if necessary. Other suitable planarization techniques are within the contemplated scope of the present disclosure. In some embodiments, the deposition process may be conducted at a temperature that falls within a range of from about room temperature to about 250° C., so as to form the third bonding layer 605 in the amorphous state and the fourth bonding layer 606 in the amorphous state respectively on the first bonding layer 603 and the second bonding layer 604. In some embodiments, each of the third bonding layer 605 and the fourth bonding layer 606 may have a thickness that falls within a range of from about 100 Å to about 2000 Å. In some embodiments, each of the third bonding layer 605 and the fourth bonding layer 606 may have a density that falls within a range of from about 3.3 g/cm$^3$ to about 3.9 g/cm$^3$. In some embodiments, each of the third bonding layer 605 and the fourth bonding layer 606 may have a surface topography that is less than or equal to about 30 Å. In some embodiments, each of the third bonding layer 605 and the fourth bonding layer 606 may have a surface roughness that is less than or equal to about 5 Å. In some embodiments, each of the third bonding layer 605 and the fourth bonding layer 606 may have a stress that falls within a range of from about −200 Mpa to about 200 Mpa. In some embodiments, each of the third metal oxide material of the third bonding layer 605 and the fourth metal oxide material of the fourth bonding layer 606 may have a general formula represented by MO$_x$, where M is selected from aluminum (Al), magnesium (Mg), titanium (Ti), zinc (Zn), or combinations thereof, and x is a number satisfying the valence of M. In some embodiments, each of the third metal oxide material of the third bonding layer 605 and the fourth metal oxide material of the fourth bonding layer 606 may include, for example, but not limited to, aluminum oxide, magnesium oxide, titanium oxide, zinc oxide, or combinations thereof. Other suitable metal oxide materials are within the contemplated scope of the present disclosure. In some embodiments where each of the third metal oxide material of the third bonding layer 605 and the fourth metal oxide material of the fourth bonding layer 606 includes titanium oxide, an atomic ratio of titanium (Ti) to oxygen (O) in each of the third bonding layer 605 and the fourth bonding layer 606 may be about 0.5. In some embodiments, an atomic percent of carbon (C) in each of the third bonding layer 605 and the fourth bonding layer 606 may be less than or equal to about 3%. In some embodiments, the first metal oxide material of the first bonding layer 603 and the third metal oxide material of the third bonding layer 605 may be the same metal oxide material, and the second metal oxide material of the second bonding layer 604 and the fourth metal oxide material of the fourth bonding layer 606 may be the same metal oxide material.

Referring to FIGS. 1 and 5, the method 100 then proceeds to step 104, where the first substrate 601 and the second substrate 602 are bonded to each other through the first bonding layer 603, the second bonding layer 604, the third bonding layer 605 and the fourth bonding layer 606. In some embodiments, step 104 may be implemented as described below.

First, a surface modification process is conducted on the third bonding layer 605 and the fourth bonding layer 606, so as to form M-OH bonds on a surface of the third bonding layer 605 opposite to the first bonding layer 603 and a surface of the fourth bonding layer 606 opposite to the second bonding layer 602. In some embodiments, the surface modification process may be conducted by a plasma treatment process. In some embodiments, the plasma treatment process may be conducted using, for example, but not limited to, nitrogen ($N_2$) plasma, argon (Ar) plasma, or the like. Other suitable plasmas are within the contemplated scope of the present disclosure. In some embodiments, the plasma treatment process may be conducted at a temperature that falls within a range of from about room temperature to about 250° C., so as to maintain the third metal oxide material of the third bonding layer 605 and the fourth metal oxide material of the fourth bonding layer 606 in the amorphous state after the plasma treatment process. In some embodiments, a gas source for conducting the plasma treatment process may include, for example, but not limited to, a gas mixture of oxygen ($O_2$) and hydrogen ($H_2$), a gas mixture of carbon dioxide ($CO_2$) and hydrogen ($H_2$), a gas mixture of nitrous oxide ($N_2O$) and hydrogen ($H_2$), or the like. Other suitable gases are within the contemplated scope of the present disclosure. In some embodiments, a rinsing process may be conducted on the third bonding layer 605 and the fourth bonding layer 606 after the plasma treatment process, so as to increase the amount of the M-OH bonds formed on the surface of the third bonding layer 605 opposite to the first bonding layer 603 and the surface of the fourth bonding layer 606 opposite to the second bonding layer 602. In some embodiments, the rinsing process may be performed with water. In some embodiments, the surface modification process may be conducted by a wet chemical process. In some embodiments, the wet chemical process may be conducted using an aqueous solution of a high temperature sulfuric peroxide mixture (HTSPM), a low temperature sulfuric peroxide mixture (LTSPM), hydrogen peroxide ($H_2O_2$), or the like. Other suitable aqueous chemical solutions are within the contemplated scope of the present disclosure. In some embodiments, the wet chemical process may be conducted using water.

Then, the first substrate 601 and the second substrate 602 are bonded to each other through the first bonding layer 603, the second bonding layer 604, the third bonding layer 605 and the fourth bonding layer 606. The first substrate 601 and the second substrate 602 are respectively mounted on an upper chuck and a lower chuck of a bonding apparatus (not shown), or vice versa. The first substrate 601 and the second substrate 602 are then aligned with each other and are brought toward each other, and a force is applied onto a surface of the second substrate 602 opposite to the first substrate 601 (or a surface of the first substrate 601 opposite to the second substrate 602) so as to allow the fourth bonding layer 606 to be in contact with the third bonding layer 605. As the fourth bonding layer 606 is brought in contact with the third bonding layer 605, the M-OH bonds polymerize to result in formation of M-O-M bonds and water molecules ($H_2O$). As the force is applied continuously, the water molecules diffuse away from an interface between the fourth bonding layer 606 and the third bonding layer 605, and the fourth bonding layer 606 starts to adhere with the third bonding layer 605 through the M-O-M bonds. In some embodiments, the semiconductor structure 600 may have a bonding strength that is greater than or equal to about 1.2 $J/m^2$.

Referring to FIGS. 1 and 6, the method 100 then proceeds to step 105, where the third bonding layer 605 and the fourth bonding layer 606 are annealed using a heat source (not shown), so as to convert each of the third bonding layer 605 and the fourth bonding layer 606 from the amorphous state to a crystalline state.

In some embodiments, the third bonding layer 605 and the fourth bonding layer 606 may be annealed at a temperature that is less than or equal to about 250° C. In some embodiments, the third bonding layer 605 and the fourth bonding layer 606 may be annealed for a period of time that falls within a range of from about 10 minutes to about 4 hours. In some embodiments, the third bonding layer 605 and the fourth bonding layer 606 may be annealed at a pressure that falls within a range of from about 1 mTorr to about 769 Torrs. In some embodiments, the third bonding layer 605 and the fourth bonding layer 606 may be annealed in an environment that contains reactant gas, for example, but not limited to, air, nitrogen gas, noble gas, or combinations thereof. Other suitable reactant gases are within the contemplated scope of the present disclosure. The reactant gas can prevent unwanted reactions of each of the third bonding layer 605 and the fourth bonding layer 606 during the thermal annealing process. In some embodiments, each of the third bonding layer 605 and the fourth bonding layer 606, after being annealed, may have an average thermal conductivity that falls within a range of from about 5.5 W/(m·K) to about 11.5 W/(m·K). In some embodiments, each of the third bonding layer 605 and the fourth bonding layer 606, after being annealed, may have a tetragonal structure and miller indices (h,k,l) of (1,0,1). In some embodiments, the semiconductor structure 600, after being annealed, may have a bonding strength that falls within a range of from about 1.6 $J/m^2$ to 2.8 $J/m^2$. In some embodiments, after the thermal annealing process, the interface between the third bonding layer 605 and the fourth bonding layer 606 may have defects (for example, but not limited to, bubbles, voids, or the like) that are smaller than or equal to 50 μm in size.

In view of the above, by virtue of each of the first bonding layer 603, the second bonding layer 604, the third bonding layer 605 and the fourth bonding layer 606 including a metal oxide material, the semiconductor structure 600 can have a high thermal conductivity. In addition, by virtue of the first bonding layer 603 including the first metal oxide material in the crystalline state and the second bonding layer 604 including the second metal oxide material in the crystalline state, the third metal oxide material of the third bonding layer 605 in the amorphous state and the fourth metal oxide material of the fourth bonding layer 606 in the amorphous state can be crystallized at a low temperature, so there can be more choices for the first to fourth metal oxide materials of the first to fourth bonding layers 603-606, the method 100 can be used in a low temperature semiconductor fabrication process, and manufacturing cost of the semiconductor structure 600 can be reduced.

In accordance with some embodiments of the present disclosure, a method for manufacturing a semiconductor structure includes: forming a first bonding layer on a first substrate, where the first bonding layer includes a first metal oxide material in an amorphous state; forming a second bonding layer on a second substrate, where the second bonding layer includes a second metal oxide material in an amorphous state; annealing the first bonding layer and the second bonding layer using a laser source, so as to convert the first metal oxide material and the second metal oxide material from the amorphous state to a crystalline state; forming a third bonding layer on the first bonding layer, where the third bonding layer includes a third metal oxide material in an amorphous state; forming a fourth bonding layer on the second bonding layer, where the fourth bonding layer includes a fourth metal oxide material in an amorphous state; bonding the first substrate and the second substrate to each other through the first bonding layer, the second bonding layer, the third bonding layer and the fourth bonding layer; and annealing the third bonding layer and the fourth bonding layer using a heat source, so as to convert the third metal oxide material and the fourth metal oxide material from the amorphous state to a crystalline state.

In accordance with some embodiments of the present disclosure, the third bonding layer and the fourth bonding layer are annealed at a temperature that is less than or equal to 250° C.

In accordance with some embodiments of the present disclosure, the first bonding layer and the second bonding layer are annealed under a circumstance where the first substrate and the second substrate are adjusted to a temperature that is less than or equal to 250° C.

In accordance with some embodiments of the present disclosure, the first substrate is formed with a semiconductor device.

In accordance with some embodiments of the present disclosure, the second substrate is formed with a semiconductor device.

In accordance with some embodiments of the present disclosure, the first metal oxide material and the third metal oxide material are the same material, and the second metal oxide material and the fourth metal oxide material are the same material.

In accordance with some embodiments of the present disclosure, with respect to each of the first metal oxide material, the second metal oxide material, the third metal oxide material and the fourth metal oxide material, metal contained in the metal oxide material is selected from aluminum, magnesium, titanium, zinc, or combinations thereof.

In accordance with some embodiments of the present disclosure, a method for manufacturing a semiconductor structure includes: forming a first bonding layer on a first substrate, where the first bonding layer includes a first metal oxide material in an amorphous state; annealing the first bonding layer using a laser source, so as to convert the first metal oxide material from the amorphous state to a crystalline state; forming a second bonding layer on a second substrate, where the second bonding layer includes a second metal oxide material in an amorphous state; annealing the second bonding layer using a heat source, so as to convert the second metal oxide material from the amorphous state to a crystalline state; forming a third bonding layer on the first bonding layer, where the third bonding layer includes a third metal oxide material in an amorphous state; forming a fourth bonding layer on the second bonding layer, where the fourth bonding layer includes a fourth metal oxide material in an amorphous state; bonding the first substrate and the second substrate to each other through the first bonding layer, the second bonding layer, the third bonding layer and the fourth bonding layer; and annealing the third bonding layer and the fourth bonding layer using a heat source, so as to convert the third metal oxide material and the fourth metal oxide material from the amorphous state to a crystalline state.

In accordance with some embodiments of the present disclosure, the third bonding layer and the fourth bonding layer are annealed at a temperature that is less than or equal to 250° C.

In accordance with some embodiments of the present disclosure, the first bonding layer is annealed under a circumstance where the first substrate is adjusted to a temperature that is less than or equal to 250° C.

In accordance with some embodiments of the present disclosure, the second bonding layer is annealed at a temperature that is greater than or equal to 280° C.

In accordance with some embodiments of the present disclosure, the first substrate is formed with a semiconductor device.

In accordance with some embodiments of the present disclosure, the second substrate is not formed with a semiconductor device.

In accordance with some embodiments of the present disclosure, the first metal oxide material and the third metal oxide material are the same material, and the second metal oxide material and the fourth metal oxide material are the same material.

In accordance with some embodiments of the present disclosure, with respect to each of the first metal oxide material, the second metal oxide material, the third metal oxide material and the fourth metal oxide material, metal contained in the metal oxide material is selected from aluminum, magnesium, titanium, zinc, or combinations thereof.

In accordance with some embodiments of the present disclosure, a method for manufacturing a semiconductor structure includes: forming a first bonding layer on a first substrate, where the first bonding layer includes a first metal oxide material in an amorphous state; forming a second bonding layer on a second substrate, where the second bonding layer includes a second metal oxide material in an amorphous state; annealing the first bonding layer and the second bonding layer so as to convert the first metal oxide material and the second metal oxide material from the amorphous state to a crystalline state, where at least one of the first substrate or the second substrate is formed with a semiconductor device, and at least one of the first bonding layer or the second bonding layer that is disposed on the at least one of the first substrate or the second substrate is annealed using a laser source; forming a third bonding layer on the first bonding layer, where the third bonding layer includes a third metal oxide material in an amorphous state; forming a fourth bonding layer on the second bonding layer, where the fourth bonding layer includes a fourth metal oxide material in an amorphous state; bonding the first substrate and the second substrate to each other through the first bonding layer, the second bonding layer, the third bonding layer and the fourth bonding layer; and annealing the third bonding layer and the fourth bonding layer using a heat source, so as to convert the third metal oxide material and the fourth metal oxide material from the amorphous state to a crystalline state.

In accordance with some embodiments of the present disclosure, the third bonding layer and the fourth bonding layer are annealed at a temperature that is less than or equal to 250° C.

In accordance with some embodiments of the present disclosure, the at least one of the first bonding layer or the second bonding layer is annealed under a circumstance where the at least one of the first substrate or the second substrate is adjusted to a temperature that is less than or equal to 250° C.

In accordance with some embodiments of the present disclosure, the first metal oxide material and the third metal oxide material are the same material, and the second metal oxide material and the fourth metal oxide material are the same material.

In accordance with some embodiments of the present disclosure, with respect to each of the first metal oxide material, the second metal oxide material, the third metal oxide material and the fourth metal oxide material, metal contained in the metal oxide material is selected from aluminum, magnesium, titanium, zinc, or combinations thereof.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:

forming a first bonding layer on a first substrate, where the first bonding layer includes a first metal oxide material in an amorphous state;

forming a second bonding layer on a second substrate, where the second bonding layer includes a second metal oxide material in an amorphous state;

annealing the first bonding layer and the second bonding layer using a laser source, so as to convert the first metal oxide material and the second metal oxide material from the amorphous state to a crystalline state;

forming a third bonding layer on the first bonding layer, where the third bonding layer includes a third metal oxide material in an amorphous state;

forming a fourth bonding layer on the second bonding layer, where the fourth bonding layer includes a fourth metal oxide material in an amorphous state;

bonding the first substrate and the second substrate to each other through the first bonding layer, the second bonding layer, the third bonding layer and the fourth bonding layer; and annealing the third bonding layer and the fourth bonding layer using a heat source, so as to convert the third metal oxide material and the fourth metal oxide material from the amorphous state to a crystalline state.

2. The method according to claim 1, wherein the third bonding layer and the fourth bonding layer are annealed at a temperature that is less than or equal to 250° C.

3. The method according to claim 1, wherein the first bonding layer and the second bonding layer are annealed under a circumstance where the first substrate and the second substrate are adjusted to a temperature that is less than or equal to 250° C.

4. The method according to claim 1, wherein the first substrate is formed with a semiconductor device.

5. The method according to claim 4, wherein the second substrate is formed with a semiconductor device.

6. The method according to claim 1, wherein:

the first metal oxide material and the third metal oxide material are the same material; and the second metal oxide material and the fourth metal oxide material are the same material.

7. The method according to claim 1, wherein, with respect to each of the first metal oxide material, the second metal oxide material, the third metal oxide material and the fourth metal oxide material, metal contained in the metal oxide material is selected from aluminum, magnesium, titanium, zinc, or combinations thereof.

8. A method for manufacturing a semiconductor structure, comprising:

forming a first bonding layer on a first substrate, where the first bonding layer includes a first metal oxide material in an amorphous state;

annealing the first bonding layer using a laser source, so as to convert the first metal oxide material from the amorphous state to a crystalline state;

forming a second bonding layer on a second substrate, where the second bonding layer includes a second metal oxide material in an amorphous state;

annealing the second bonding layer using a heat source, so as to convert the second metal oxide material from the amorphous state to a crystalline state;

forming a third bonding layer on the first bonding layer, where the third bonding layer includes a third metal oxide material in an amorphous state;

forming a fourth bonding layer on the second bonding layer, where the fourth bonding layer includes a fourth metal oxide material in an amorphous state;

bonding the first substrate and the second substrate to each other through the first bonding layer, the second bonding layer, the third bonding layer and the fourth bonding layer; and annealing the third bonding layer and the fourth bonding layer using a heat source, so as to convert the third metal oxide material and the fourth metal oxide material from the amorphous state to a crystalline state.

9. The method according to claim 8, wherein the third bonding layer and the fourth bonding layer are annealed at a temperature that is less than or equal to 250° C.

10. The method according to claim 8, wherein the first bonding layer is annealed under a circumstance where the first substrate is adjusted to a temperature that is less than or equal to 250° C.

11. The method according to claim 8, wherein the second bonding layer is annealed at a temperature that is greater than or equal to 280° C.

12. The method according to claim 8, wherein the first substrate is formed with a semiconductor device.

13. The method according to claim 12, wherein the second substrate is not formed with a semiconductor device.

14. The method according to claim 8, wherein:

the first metal oxide material and the third metal oxide material are the same material; and the second metal oxide material and the fourth metal oxide material are the same material.

15. The method according to claim 8, wherein, with respect to each of the first metal oxide material, the second metal oxide material, the third metal oxide material and the fourth metal oxide material, metal contained in the metal oxide material is selected from aluminum, magnesium, titanium, zinc, or combinations thereof.

16. A method for manufacturing a semiconductor structure, comprising:

forming a first bonding layer on a first substrate, where the first bonding layer includes a first metal oxide material in an amorphous state;

forming a second bonding layer on a second substrate, where the second bonding layer includes a second metal oxide material in an amorphous state;

annealing the first bonding layer and the second bonding layer so as to convert the first metal oxide material and the second metal oxide material from the amorphous state to a crystalline state, where at least one of the first substrate or the second substrate is formed with a semiconductor device, and at least one of the first bonding layer or the second bonding layer that is disposed on the at least one of the first substrate or the second substrate is annealed using a laser source;

forming a third bonding layer on the first bonding layer, where the third bonding layer includes a third metal oxide material in an amorphous state;

forming a fourth bonding layer on the second bonding layer, where the fourth bonding layer includes a fourth metal oxide material in an amorphous state;

bonding the first substrate and the second substrate to each other through the first bonding layer, the second bonding layer, the third bonding layer and the fourth bonding layer; and annealing the third bonding layer and the fourth bonding layer using a heat source, so as to convert the third metal oxide material and the fourth metal oxide material from the amorphous state to a crystalline state.

17. The method according to claim 16, wherein the third bonding layer and the fourth bonding layer are annealed at a temperature that is less than or equal to 250° C.

18. The method according to claim 16, wherein the at least one of the first bonding layer or the second bonding layer is annealed under a circumstance where the at least one of the first substrate or the second substrate is adjusted to a temperature that is less than or equal to 250° C.

19. The method according to claim 16, wherein:

the first metal oxide material and the third metal oxide material are the same material; and the second metal oxide material and the fourth metal oxide material are the same material.

20. The method according to claim 16, wherein, with respect to each of the first metal oxide material, the second metal oxide material, the third metal oxide material and the fourth metal oxide material, metal contained in the metal oxide material is selected from aluminum, magnesium, titanium, zinc, or combinations thereof.

* * * * *